United States Patent [19]

Horvat

[11] Patent Number: 4,600,890
[45] Date of Patent: Jul. 15, 1986

[54] DEMODULATOR COMPRISING A PHASE-LOCKED LOOP

[75] Inventor: Philippe Horvat, Saint-Pierre-du-Vauvray, France

[73] Assignee: U.S. Philips Corporation, New York, N.Y.

[21] Appl. No.: 693,916

[22] Filed: Jan. 23, 1985

[30] Foreign Application Priority Data

Jan. 25, 1984 [FR] France .................................. 84 01127

[51] Int. Cl.⁴ ............................................ H03D 3/02
[52] U.S. Cl. ................................... 329/122; 329/131; 455/240
[58] Field of Search ....................... 329/122, 124, 131; 455/214, 234, 239, 240, 245

[56] References Cited

U.S. PATENT DOCUMENTS 4,146,843 3/1979 Isobe .............................. 329/122 X
4,156,195 5/1979 GrosJean ........................ 329/122 X Primary Examiner—Eugene R. LaRoche
Assistant Examiner—Robert J. Pascal
Attorney, Agent, or Firm—William J. Streeter; Edward W. Goodman

[57] ABSTRACT

Phase or frequency demodulator comprising an automatic gain control circuit (100), a phase-locked loop (200) and, optionally, a shaping circuit (300) for shaping the output signal of the loop. A feedback path is provided between the output of the loop, or of the signal-shaping circuit, and the automatic gain control circuit, via an automatic noise control circuit (400) for producing an analog signal, the amplitude of which is proportional to the rate at which the loop is temporarily disabled.

5 Claims, 2 Drawing Figures

DEMODULATOR COMPRISING A PHASE-LOCKED LOOP

BACKGROUND OF THE INVENTION

The present invention relates to a demodulator comprising a phase-locked loop. A particularly interesting field of application of this invention is the field of satellite television.

Actually, the spatial links preferably utilize angular modulation (phase or frequency) for two main reasons: the power limitation of the transmitters installed on board satellites and the necessary for the highest possible background noise immunity. On reception of signals coming from a satellite, three main parameters must be optimized to make the best possible use of these signals: the gain of the receiving aerial, the noise factor of the high-frequency input amplifier and the demodulation threshold. The control of this third parameter, the demodulation threshold, is the object of the present invention.

Whatever the use of the demodulator, the curve $P_{SV}/P_{BV} = f(P_{HF}/P_{BC})$, where $P_{SV}$, $P_{BV}$, $P_{HF}$ and $P_{BC}$ represent the power of the demodulated video signal, the video noise power, the power of the HF carrier and the HF noise power in the channel, respectively, has a bend beyond which the ratios $P_{HF}/P_{BC}$ and $P_{SV}/P_{BV}$ evolve substantially proportionally, but below which $P_{SV}/P_{BV}$ degrades very rapidly when $P_{HF}/P_{BC}$ decreases. The value of $P_{HF}/P_{BC}$ corresponding to this bend, called the demodulation threshold, depends on the type of demodulator used.

SUMMARY OF THE INVENTION

For the above-mentioned specific application (the reception of television signals transmitted by satellite), the frequency demodulators suitable for use are of two main types, namely phase-shifting demodulators associated with limiters and demodulators comprising a phase-locked loop associated with an automatic gain control amplifier. The invention described herein relates to loop demodulators of this latter type which, for a comparable pass-band and demodulation quality, have a better threshold (by approximately two decibels in the present case, when the measures of the invention are not used). Such a performance is, however, still not sufficient, when the noise conditions become really bad.

To improve the reception when the input signals become weak and when the modulation is significantly distorted, Japanese Patent Application No. 56-199633, filed on Dec. 10, 1981, which describes a demodulator comprising fundamentally an automatic gain control circuit, a phase-locked loop and a return path by means of which feedback of the loop to the automatic gain control circuit is realized, provides as feedback type the modification of the capacitance of a variable capacitor of a tuned circuit arranged at the input of the demodulator, so as to have the disposal of a narrow filtering circuit by means of which it is possible to reduce the equivalent noise band, which follows the incoming signal in its frequency swing.

A further object of the invention is to improve the receiving conditions in a demodulator of the type described in the above-mentioned Japanese Patent Application, by providing a different type of feedback, acting on the amplitude of the incoming signal instead of on the way in which it is filtered.

To this effect, in a phase or frequency demodulator comprising an automatic gain control circuit for producing from the non-controlled incoming carrier wave, a modulated signal of a constant average level, and also a phase-locked loop for producing a demodulated signal from said modulated signal, and optionally a signal-shaping circuit for shaping the output signal of the loop, a feedback path being inter alia provided between the output of the loop or of the signal-shaping circuit and the automatic gain control circuit, said demodulator according to the invention is characterized in that said path comprises an automatic noise control circuit for producing an analog signal proportional to the rate at which the loop is temporarily disabled.

The proposed structure has the advantage that it provides, in a simple way, a measurement of the noise acting on the input signals of the demodulator, by estimating the rate at which the loop is disabled owing to noise and by modifying the gain of the automatic gain control circuit after this estimation.

DESCRIPTION OF THE DRAWING

Particulars and advantages of the invention will become apparent from the following detailed description given by way of non-limitative example with reference to the accompanying drawing, in which.

DESCRIPTION OF THE PREFERRED EMBODIMENT

Figure 1:
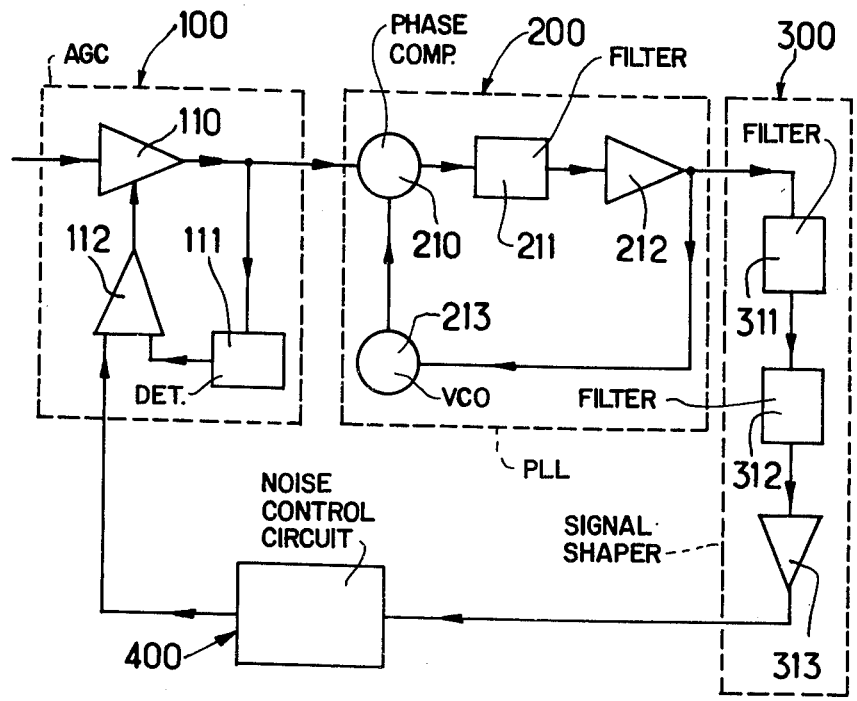
FIG. 1 shows an embodiment of a demodulator comprising an automatic noise control circuit in accordance with the invention.
Figure 2:
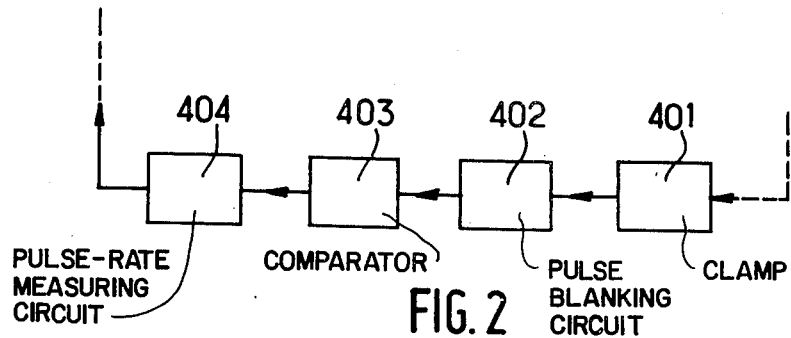
• FIG. 2 shows in greater detail an embodiment of the automatic noise control circuit.

The demodulator shown in FIG. 1 comprises the following circuits: an automatic gain control circuit 100, a phase-locked loop 200, a signal-shaping circuit 300, an automatic noise control circuit 400. These circuits are described, in the above succession, herebelow.

The automatic gain control circuit 100 comprises a voltage-controlled variable-gain amplifier 110 which receives the carrier-wave present at the input of the demodulator and whose output is measured with the aid of a detector 111 (for example a diode detector). The value of the amplitude thus obtained is conveyed to the first terminal of an amplifier 112 in which this value is compared with a reference voltage which is present at the second input of the amplifier 112 and has been determined in a way which will be described hereinafter; the error voltage produced by this amplifier 112 controls the gain of the amplifier 110. This automatic gain control circuit 100 renders it possible to apply to the input of the circuit 200, which constitutes the actual demodulating portion, the frequency-modulated carrier with an average level which is kept constant.

The phase-locked loop 200 comprises in a conventional way a phase comparator 210, a loop filter 211 (optionally), an amplifier 212 and a voltage-controlled oscillator 213. The phase comparator 210, which in this example comprises a balanced mixer, receives the controlled carrier produced by the amplifier 110 of circuit 100 and also the output signal of the voltage-controlled oscillator 213 and produces a voltage which is substantially proportional to the phase deviation between these two incoming signals. After having passed through the loop filter 211, this voltage is received by the amplifier 212 which produces an amplifier voltage which constitutes, at the same time, the output signal of the loop and the frequency control signal of the oscillator 213. Thanks to this control, the oscillator 213 reliably reproduces, in the locked situation of the loop, the frequency variations of the incoming signal (this incoming signal is the level-controlled carrier produced by the automatic gain control circuit 100). The signal-shaping circuit 300 comprises a low-pass deemphasis filter 311, a band rejection filter 312, for suppressing or not suppressing the sound subcarrier, and an amplifier 313 for bringing the video signal to the level which corresponds to the relevant transmission standard.

In accordance with the invention the return path to the automatic gain control circuit 100, formed here from the output of the circuit 300 or, if this circuit is not present, from the output of the phase-locked loop 200 is realized with the aid of the automatic noise control circuit 400, which takes the signal from the output of the demodulator (or the output signal of the amplifier 313 of the circuit 300 or from the amplifier 212 of the loop 200, as the case may be) and re-injects it, after appropriate processing as described below, via the second terminal of the amplifier 112 where it constitutes said reference voltage value.

The automatic noise control circuit 400 comprises a clamping circuit 401 for clamping synchronizing pulses on the lower level, a pulse blanking circuit 402, a comparator circuit 403 and a pulse-rate measuring circuit 404.

This circuit 400 operates as follows. When the noise on the carrier increases (which consequently results in a decrease of $P_{HF}/P_{BC}$), the video noise increases, while the $P_{SV}/P_{BV}$ also decreases, and the loop 200 is temporarily unlocked, or disabled, when the demodulation threshold is approached. These random disabling operations cause positive and negative voltage swings of the demodulated signal, in the form of pulses of approximately uniform durations and amplitudes which cause white and black points to appear in the television picture, which significantly deteriorates the quality of this picture. A decrease in the global gain of the loop enables, by lowering the demodulation threshold, an improvement of the ratio $P_{SV}/P_{BV}$ and a noticeable reduction of the number of disabling pulses.

This reduction of the loop gain is here realized by reducing the sensitivity of the mixer 210, while reducing the amplitude of the incoming carrier. Such a decrease is obtained by modifying the reference voltage of the amplifier 112 as a function of the disable pulse rate of the loop 200. Actually, after clamping and suppressing the synchronizing pulses, the comparator circuit 403 in the circuit 400 renders it possible, with the aid of two parallel-arranged comparators one with a high threshold and the other with a low threshold, respectively, to suppress the video signal almost completely and to select only the positive and the negative pulses superposed on this video signal. Then the circuit 404 produces, for example by integration or differentiation and calculating the mean value, a voltage, the amplitude of which is proportional to the rate of these pulses and which is the useful information applied to the reference input of the amplifier 112. A digital solution by counting pulses is, obviously, alternatively possible, it then being necessary to provide a digital-to-analog converter before re-injection of the signal into the amplifier 112.

Instead of detecting whether two thresholds situated on both sides of the video signals are exceeded, it is possible to effect only one of these detections. It is alternatively possible to effect this pulse rate measurement not during the period of the video signal but during the period of the synchronizing pulses by clamping these pulses on the low level without suppressing them (thereafter, as in the foregoing, a comparison is made with an appropriate threshold and the rate of the negative pulses superposed on these synchronizing pulses is measured).

What is claimed is:

1. A phase or frequency demodulator comprising an automatic gain control circuit for producing from a non-controlled incoming carrier wave, a modulated signal of a constant average level, and a phase-locked loop for producing a demodulated signal from said modulated signal characterized in that said demodulator further comprises an automatic noise control circuit, arranged in a feedback path between said loop and said automatic gain control circuit, for producing an analog signal, an amplitude of which is proportional to the rate at which the loop is temporarily disabled.

2. A demodulator as claimed in claim 1, characterized in that the automatic noise control circuit comprises a circuit for clamping synchronizing pulses, contained in said carrier wave, onto a lower level thereof, a comparator circuit having a reference level substantially equal to the lower level, and a circuit for measuring the rate of the negative pulses decreasing to below this threshold.

3. A demodulator as claimed in claim 1, characterized in that the automatic noise control circuit comprises a circuit for clamping synchronizing pulses, contained in said carrier wave, onto a lower level thereof, a circuit for suppressing these pulses, a comparator circuit having two predetermined reference levels lower than or equal to this lower level and higher than a so-called white level, respectively, and a circuit for measuring the rate of the negative pulses which fall below the lower reference level and positive pulses exceeding the higher reference level.

4. A demodulator as claimed in claim 1, characterized in that the automatic noise control circuit comprises a clamping circuit for clamping synchronizing pulses, contained in said carrier wave, onto a higher level, commonly denoted as the white level, a comparator circuit having a reference level at least equal to said higher level, and a circuit for measuring the rate of the positive pulses exceeding the reference level.

5. A demodulator as claimed in claim 2, 3 or 4, characterized in that the pulse rate measuring circuit comprises a counter followed by a digital-to-analog converter.

* * * * *